(12) United States Patent
Hasegawa

(10) Patent No.: US 7,652,309 B2
(45) Date of Patent: Jan. 26, 2010

(54) SOLID STATE IMAGING MODULE

(75) Inventor: Jun Hasegawa, Miyagi (JP)

(73) Assignee: Fujifilm Corporation, Minato-ku, Tokyo (JP)

( * ) Notice: Subject to any disclaimer, the term of this patent is extended or adjusted under 35 U.S.C. 154(b) by 0 days.

(21) Appl. No.: 11/288,248

(22) Filed: Nov. 29, 2005

(65) Prior Publication Data

US 2006/0113572 A1 Jun. 1, 2006

(30) Foreign Application Priority Data

Nov. 30, 2004 (JP) ............... 2004-346628
Nov. 30, 2004 (JP) ............... 2004-346629

(51) Int. Cl.
*H01L 31/0328* (2006.01)
(52) U.S. Cl. ............... 257/184; 257/80; 257/83; 257/257; 257/444; 257/E31.058
(58) Field of Classification Search ............... 257/57, 257/59, 72, 257, 290, 351, 368, 80, 83, 184, 257/444
See application file for complete search history.

(56) References Cited

U.S. PATENT DOCUMENTS

| | | | |
|---|---|---|---|
| 5,692,025 A | * | 11/1997 | Sato et al. ............ 377/58 |
| 2001/0038064 A1 | * | 11/2001 | Mori et al. ............ 250/208.1 |

FOREIGN PATENT DOCUMENTS

| | | |
|---|---|---|
| JP | 9-74521 | 3/1997 |
| JP | 2002-262186 | 9/2002 |

OTHER PUBLICATIONS

Notice of Reasons of Rejection dated Nov. 18, 2008 with an English translation.

* cited by examiner

*Primary Examiner*—Wai-Sing Louie
(74) *Attorney, Agent, or Firm*—McGinn IP Law Group, PLLC

(57) ABSTRACT

A CCD solid state imaging module comprises a CCD area sensor, a substrate bias voltage setting device formed on said CCD area sensor for outputting a voltage, and a substrate bias voltage outputting device formed on a chip other than said CCD area sensor for outputting a substrate bias voltage of said CCD area sensor by selecting one voltage level from a plurality of voltages based on the voltage output by said substrate bias voltage setting device. A solid state imaging module suitable for a CCD area sensor having multiple driving modes can be provided.

9 Claims, 4 Drawing Sheets

SOLID STATE IMAGING MODULE

CROSS REFERENCE TO RELATED APPLICATION

This application is based on Japanese Patent Application 2004-346628, filed on Nov. 30, 2004, and Japanese Patent Application 2004-346629, filed on Nov. 30, 2004, the entire contents of which are incorporated herein by reference.

BACKGROUND OF THE INVENTION

A) Field of the Invention

This invention relates to a solid state imaging module and more specifically relates to a CCD area sensor for a digital still camera and a cellular phone.

B) Description of the Related Art

Conventionally, a CCD area sensor for a digital still camera and a cellular phone generally uses a substrate drain type electronic shutter for setting an exposure time.

That type of the CCD area sensor has photodiodes (photo electronic conversion elements) and transfer channels made of n-type regions formed in a p-well formed in an n-type substrate NSUB. The maximum (saturation) amount of electric charges stored in the photodiode is defined by an electrical potential of the substrate NSUB (n-type substrate). That is, if the electrical potential of the substrate NSUB is low, then the saturation electric charge amount is large, and when the electrical potential of the substrate NSUB gets higher, the saturation electric charge amount becomes small. When the electrical potential of the substrate NSUB gets extremely higher, all the electric charges accumulated in the photodiode are drained to the substrate.

By using the above-described property, the electronic shutter for starting electric charge accumulation in the photodiode is performed by impressing a high voltage to the substrate NSUB at the initial state of the exposure to drain the electric charges accumulated in the photodiode, and then returning the electrical potential of the substrate NSUB to the original voltage.

The electrical potential of the substrate NSUB is defined by the saturation electric charge amount of the photodiode during the exposure, and it is set to about 10V. Moreover, an impressing voltage for draining excessive electric charges to the substrate is generated by multiplying an amplitude pulse at about 20V to the voltage for the above-described operation.

FIG. 7 shows a circuit for supplying a NSUB voltage according to the prior art. As shown in the drawing, the circuit is consisted of bleeder resistors R1 and R2 and a diode D1 for generating DC bias, a condenser C1 for AC coupling and a clock driver 10.

During the exposure, a DC voltage (about 10V) defined by the resistors R1 and R2 is impressed to the NSUB. At this time, an output of the clock driver 10 is at a low level. The output of the clock driver 10 becomes a high level just before the next exposure is started after the electric charges accumulated in the photodiodes are read-out, the NSUB potential becomes high (for example, 32.5V) by the amplitude (for example, 22.5V) of the clock driver by C-coupling, and the excessive electric charges which have been accumulated just before that are drained to the NSUB. At this time, the diode D1 is turned off by reverse bias so that the bleeder resistors and the NUSB are electrically disconnected.

Although the DC voltage level impressed to the NUSB during the exposure defines the saturation output electric charge amount of the photodiode, the relationship between them varies according to unevenness of manufacturing processes; therefore, a recent CCD area sensor has built-in bleeder resistors and a fuse and is set to output a unique DC voltage by adjusting it at the time of shipping inspection.

The saturation level of the photodiode of CCD area sensor to date does not have to be changed according to image capturing modes because all pixel reading out has been a premises for a still picture and a movie. However, it becomes difficult to capture a movie with reading out all the pixels due to increase in the number of the pixels. Therefore, thinning out the number of pixels is performed by not reading out electric charges from a certain number of pixels to a transfer channel or mixing (the adding) outputs of two pixels in the transfer channel is performed at the time of taking a movie.

When the output electric charges of the pixels are added in the transfer channel, the electric charges may be overflow from the transfer channel if the saturation output level is high because the transfer channel has to deal with the electric charges of two pixels. Therefore, when the pixel output electric charges are added in the transfer channel, the saturation level of the photodiode has to be low.

Therefore, it has been suggested in the Japanese Laid-open Patent No. 2002-26186 that the NSUB voltage level is switched according to an imaging mode. When the pixel output electric charges are added in the transfer channel, a barrier formed by the p-well is lowered by increasing the NSUB electric potential to lower the saturation output level of the photodiode. When the pixel output electric charges are not added in the transfer channel (i.e., in an all pixel mode), the NSUB electric potential is lowered to increase the saturation output level of the photodiode.

FIG. 8 shows a circuit for switching the NSUB voltage levels according to the prior art. In the circuit shown in the drawing, an external resistor R3 is equipped, and connection and disconnection of the resistor R3 is switched by a mode signal "Mod" to switch between two levels of the DC voltage.

If the bleeder resistor is simply consisted of the resistors R1 and R2, the DC bias is defined only by a resistance ratio not depending on absolute value of the resistance of each resistor. However, if the external resistor R3 is added as in the above-described circuit for switching the NSUB voltage levels, the absolute value of each resistor is required to be precise for defining two voltage levels exactly, and therefore, a production output may be lowered.

Moreover, when all the resistors R1, R2 and R3 are not made of the same material, the DC bias may be changed due to differences in temperature coefficients of the resistors, and therefore to avoid that, all the resistors R1, R2 and R3 have to be built in the CCD module.

Further, it is possible to remove the circuit for generating the bias voltage from the CCD area sensor and to equip the circuit with a peripheral circuit. In this case, a manufacturing cost will increase because it becomes necessary to execute adjustment for absorb individual difference of the CCD area sensor after the CCD area sensor is assembled.

When a power source is turned on or turned off, the NSUB electrical potential may be negative. Normally. The CCD area sensor is formed in the p-well of the n-type substrate, and the p-well is grounded. When the n-type substrate becomes negative potential, a pn-junction is forward biased, and excessive current may cause damage in reliability or in an extreme case break down of the CCD area sensor.

SUMMARY OF THE INVENTION

It is an object of the present invention to provide a solid state imaging module suitable for a CCD area sensor having multiple driving modes.

It is another object of the present invention to provide a solid state imaging module that can prevent generation of excessive current caused by impression of forward bias to a pn-junction of a CCD area sensor.

According to one aspect of the present invention, there is provide a CCD solid state imaging module, comprising: a CCD area sensor; a substrate bias voltage setting device formed on said CCD area sensor for outputting a voltage; and a substrate bias voltage outputting device formed on a chip other than said CCD area sensor for outputting a substrate bias voltage of said CCD area sensor by selecting one voltage level from a plurality of voltages based on the voltage output by said substrate bias voltage setting device.

According to another aspect of the present invention, there is provided a CCD solid state imaging module, comprising: a CCD area sensor having an n-type substrate and a p-well formed in said n-type substrate; and an excessive current preventing device that prevents a forward bias from impressing to a pn-junction between said n-type substrate and said p-well.

According to the present invention, a solid state imaging module suitable for a CCD area sensor having multiple driving modes can be provided.

According to the present invention, a solid state imaging module that can prevent generation of excessive current caused by impression of forward bias to a pn-junction of a CCD area sensor can be provided.

BRIEF DESCRIPTION OF THE DRAWINGS

FIG. 3A to FIG. 3C are timing charts showing timings for impressing voltages when the power is turned on.

DETAILED DESCRIPTION OF THE PREFERRED EMBODIMENTS

Figure 1:
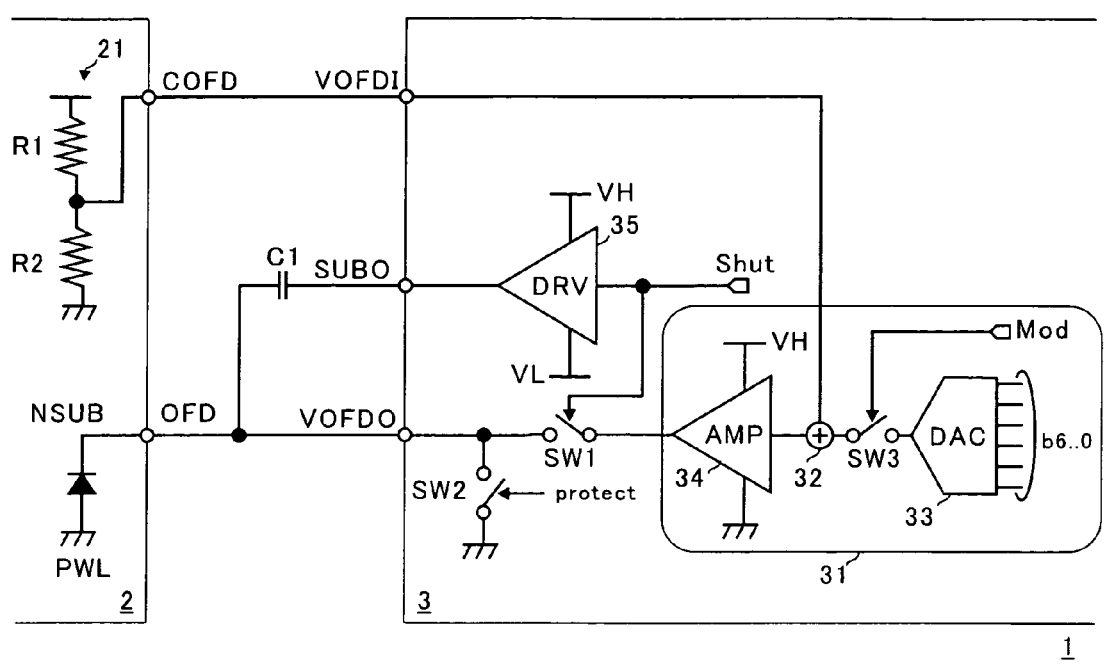
FIG. 1 is a block diagram showing a solid state imaging module 1 according to an embodiment of the present invention.

FIG. 1 is a block diagram showing a solid state imaging module 1 according to an embodiment of the present invention. The solid state imaging module 1 is consisted of at least a CCD area sensor 2 and a peripheral (an analogue signal process) IC 3.

Figure 2:
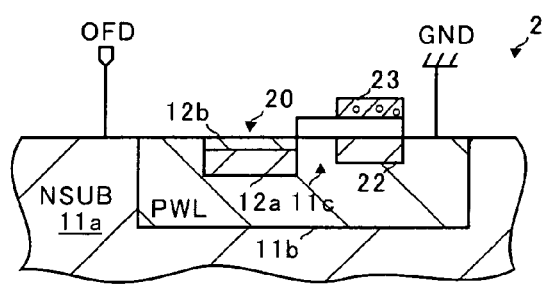
FIG. 2 is a cross sectional view showing a structure of a CCD area sensor 2 according to the embodiment of the present invention.

FIG. 2 is a cross sectional view showing a structure of a CCD area sensor 2 according to the embodiment of the present invention.

The CCD area sensor 2 has, for example, an n-type silicon substrate (NSUB) 11a and an p$^-$-type impurity doped region (PWL) 11b formed in a surface of the NSUB. An n-type impurity doped region 12a is formed at a predetermined position of this p$^-$-type impurity doped region 11b by ion-implantation and functions as an electric charge accumulating region. A surface of the n-type impurity doped region 12a is converted to a p$^+$-type impurity doped region 12b by the ion implantation, and a buried-type photodiode is formed. Also, an n-type impurity doped region (transfer channel) 22 is formed in the p$^-$-type impurity doped region 11b along the column of the photodiodes 20 via reading gate channel regions 11c. For example, multi-layered polysilicon electrodes (transfer electrodes) 23 are formed over the transfer channel 22.

In a bleeder resistor 21 formed inside the CCD area sensor 2, resistors R1 and R2 are adjusted by polysilicon fuse in order to adjust the saturation output of the photodiodes 20 to a predetermined level. The output voltage of this bleeder resistor is output as the COFD to a peripheral integrated circuit (IC) 3.

The COFD voltage (VOFDI) input to the peripheral IC 3 is connected to one input terminal of an analogue adding device 32 in a bias modulation circuit 31. The output of a D/A converter 33 is connected to another input terminal of the analogue adding device 32 via an analogue switch SW3.

The analogue switch SW3 is controlled by a control signal Mod. When the Mod signal is at a low level, the analogue switch SW3 is turned off, and the output voltage of the D/A converter 33 is cut off not to input to an operational amplifier 34; therefore, the COFD voltage (VOFDI) input to the peripheral IC 3 is impressed to the input terminal of the operational amplifier 34. When the Mod signal is at a high level, the switch SW3 is turned on (closed), and the output voltage of the D/A converter 33 and the COFD voltage input to the peripheral IC 3 are added by the analogue adding device 32 and impressed to the input terminal of the operational amplifier 34.

The voltage input to the operational amplifier 34 is impedance-converted and connected to the analogue switch SW1. The analogue switch SW1 is controlled by a Shut signal. When the Shut signal is at a low level, that is, during the exposure period, the switch SW1 is turned on, and the DC voltage (VOFDO) output from the operational amplifier 34 is impressed to the NSUB (n-type substrate) of the CCD area sensor 2.

By the above-described structure. The DC bias can be selected from a standard voltage level (the first voltage level) adjusted in the bleeder resistor 21 in the CCD area sensor 2 and a voltage level (the second voltage level) supplied from the D/A converter and generated by adding the modulation voltage to the standard voltage for output. That is, the DC bias can be selected from a plurality of voltage levels based on the standard voltage level.

Moreover, when the Shut signal becomes a high level, the analogue switch SW1 is turned off, and the bias modulation circuit 31 and the output terminal VCFDO are electrically disconnected. Then, a subtracted (VH−VL) voltage (for example, 15V−(−7.5V)=22.5V) is impressed to the NSUB terminal OFD via a capacity coupling and multiplied with the original DC bias voltage by stopping impressing the DC bias voltage to the NSUB terminal and simultaneously by the output (SUBO) of the clock driver 35 being VH from VL. By that, excessive electric charges in the photodiode are drained to the NSUB.

Thereafter, when the Shut signal returns to the low level, the original DC voltage (the output voltage VOFDO from the operational amplifier 34) will be impressed. Accumulation of the electric charges generated by the photodiode is started after that, and the electric charge accumulation will be executed at a saturation level defined by the bias voltage of the NSUB.

An analogue switch SW2 is an analogue switch controlled by a Protect signal. When the Protect signal is at high level, the switch SW2 is turned on, and the NSUB electric potential can be clipped to a GND level.

As shown in FIG. 2, in the CCD area sensor 2, the NSUB forms a parasitic diode between the p-well PWL connected to the ground electric potential GND. Therefore, if the NSUB electric potential becomes greater than the PWL electric potential that equals to the GND (NSUB>PWL=GND) during the booting up process, the pn-junction will be forward biased, and excessive current caused by that may cause break down of the CCD area sensor.

Figure 3A:
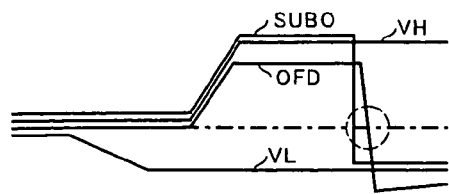

For example, as shown in FIG. 3A, when the CCD area sensor is booted up with a sequence wherein the Shut signal is at the high level, that is, the output (SUBO) of the clock driver is VH and thereafter the Shut signal will be at the low level, the NSUB (OFD) may be negative voltage, and the junction may be forward biased because the VIFDO that had been at about 10V decreases by the voltage modulation, i.e., 22.5V by the C-Coupling at the moment when the output (SUBO) of the dock driver becomes VL from VH. At this time, excessive current flows in a part enclosed by a circle in the drawing.

Figure 3C:
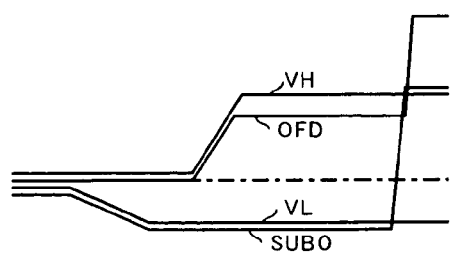
Figure 3B:
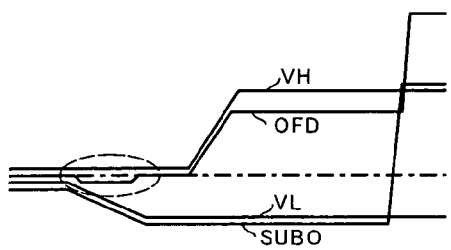

Therefore, as shown in FIG. 3, it is necessary to start under a condition that the output of the clock driver becomes VL. However, in this case, when the VL power source boots up, the NSUB electric potential (OFD) may be pulled to a negative direction by C-Coupling, and there is possibility for the junction to be forward biased. At this time, excessive electric current flows in a part circled in the drawing.

In the embodiment of the present invention, the VOFDO voltage (OFD) is clipped on the GND level as shown in FIG. 3C by turning on the analogue switch SW2 with the Protect signal at a time of turning on the power so that impression of the negative voltage to the NSUB of the CCD sensor 2 can be prevented.

Further, by turning on the analogue switch SW2 by the Protect signal at a time of shutting down the power source for controlling the VOFDO voltage (OFD) to be clipped at the GND level, it can be prevented that the pn-junction of the NSUB and the PWL is forward biased and also it can be prevented that the negative voltage is impressed to the NSUB of the CCD area sensor 2.

Figure 4:
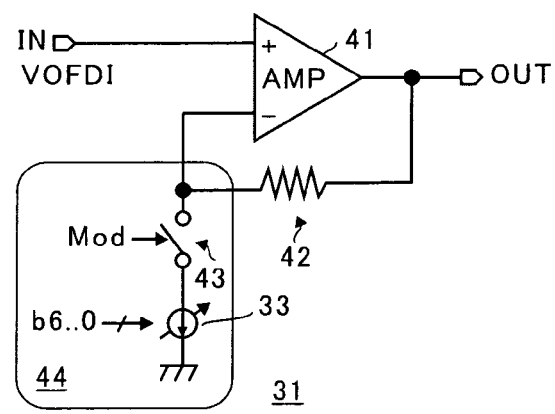
FIG. 4 is a circuit diagram showing an example of a structure of a bias modulation circuit 31 according to the embodiment of the present invention.

FIG. 4 is a circuit diagram showing an example of a structure of a bias modulation circuit 31 according to the embodiment of the present invention. The input voltage VOFDI is connected to a non-inverted input terminal (+) of the operational amplifier 41 to which a positive power VH and a negative power VL are supplied, and a feedback resistor 42 is positioned between an inverted input terminal (−) and an output terminal (OUT). The function of the operational amplifier 34 in FIG. 1 can be obtained. One terminal of a switch 43 controlled by the Mod signal is connected to the inverted input terminal (−), and a variable current source 44 is connected to another terminal of the switch 43. The current value of the variable current source 44 is controlled with a digital signal to be input. Voltage decline is formed by flowing this electric current through the feedback resistor 42. Functions of the DAC 33, the switch SW3 and the analogue adding device 32 in FIG. 1 can be obtained.

Figure 5A:
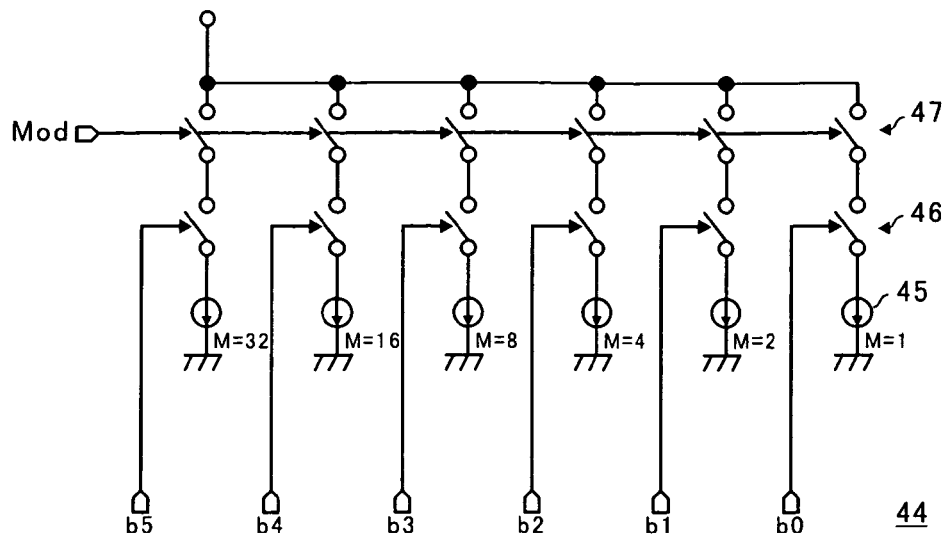
FIG. 5A and FIG. 5B are circuit diagrams showing examples of variable current source 44 according to the embodiment of the present invention.
Figure 5B:
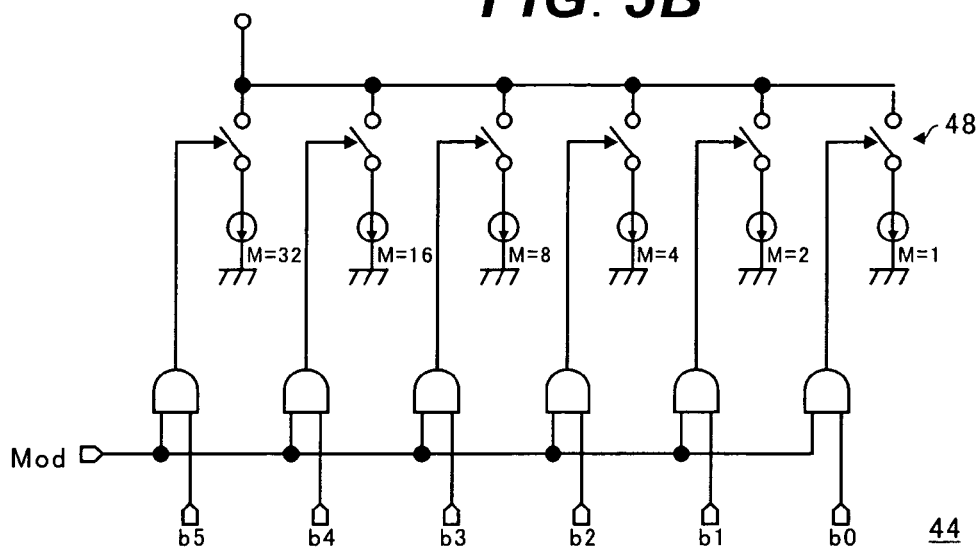

FIG. 5A and FIG. 5B are circuit diagrams showing examples of variable current source 44 according to the embodiment of the present invention.

The variable current source 44 is consisted of a plurality of current sources 45 weighted with binaries (M=1, 2, 4, 8, 16, 32), a switch 46 for bit-setting, and a switch 47 controlled by the Mod signal for defining impressing current. After defining the current to be flown by the bit data, it is switched whether the signal is flown or not by the Mod signal. Moreover, the variable current source 44 may be formed with a structure shown in FIG. 5B. A control signal combined with the function of the switch 47 is formed by taking "AND" of each binary bit data 44 and the mode signal Mod, and each one switch 48 is turned on and off.

By forming the variable current source 44 with the above-described structure, a variable control of the electric current will be possible by changing setting of the binary data (b0 to b5). This is for avoiding necessity of preparation of the peripheral IC 3 for each CCD corresponding to variation of the modulation voltages according to a type of the CCD and for increasing precision of the modulation voltage by adjusting the variation of the modulation voltages according to unevenness of manufacturing of the feedback resistors. Moreover, the set bit is set to a predetermined voltage with the PROM such as the fuse at a time of shipping of the peripheral IC 3.

Figure 6:
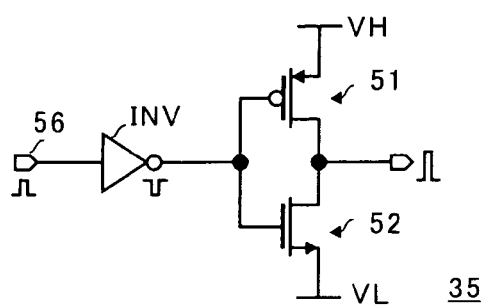
FIG. 6 is a circuit diagram showing an example of a structure of a clock driver 35 according to the embodiment of the present invention.
Figure 7:
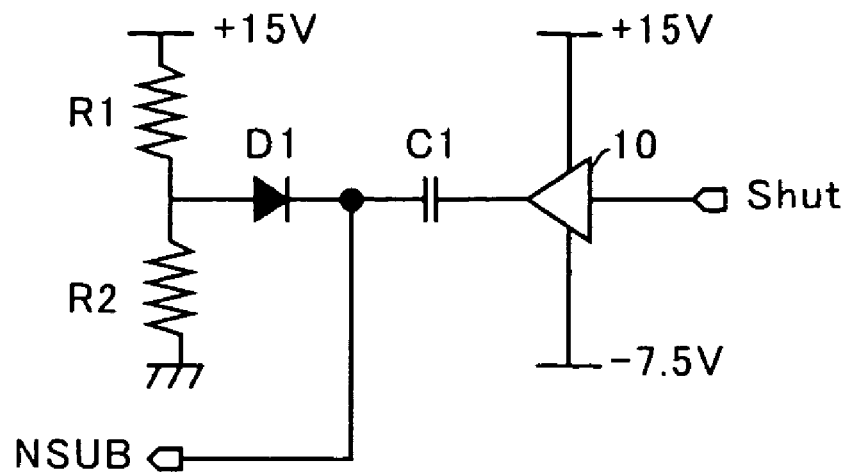
FIG. 7 shows a circuit for supplying a NSUB voltage according to the prior art.
Figure 8:
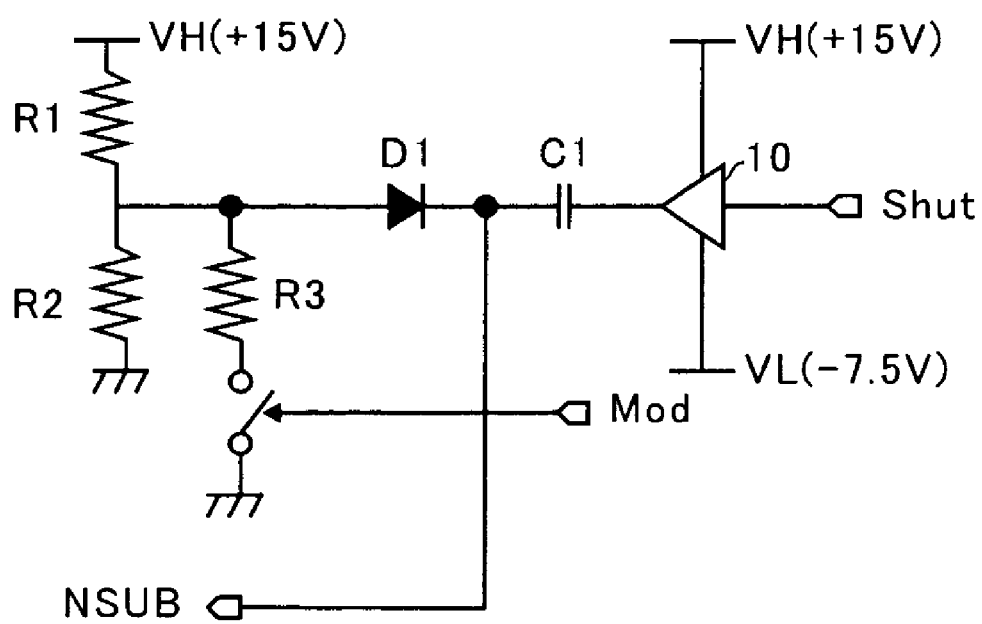
FIG. 8 shows a circuit for switching the NSUB voltage levels according to the prior art.

FIG. 6 is a circuit diagram showing an example of a structure of a clock driver 35 according to the embodiment of the present invention. A shutter signal supplied to a terminal 56 is a signal of low L at a normal state or high H at a time of starting the shutter and is converted to a signal of high H at a normal state or low L at a time of starting the shutter by an inverter INV. A driver 58 is consisted of a CMOS including a series connection of a p-channel MOS transistor 51 and an n-channel MOS transistor 52. When the VH is output, the input becomes low L, and the p-channel MOS transistor 51 is turned on. When the VL is output, the input becomes high H, and the n-channel MOS transistor 52 is turned on.

As described in the above, according to the embodiments of the present invention, with restraining increase in the number of the terminals of the CCD area sensor, the control with high precision becomes possible by equipping the peripheral analogue signal process IC for driving the CCD are sensor with a setting means of the NSUB voltage other than building in the CCD area sensor.

Moreover, since a voltage adjustment mechanism for absorbing individual differences among the CCD area sensors are left inside the CCD area sensor, an optimization adjustment of the CCD area sensor can be executed at a time of shipping; therefore, the adjustment as a solid state imaging module which the CCD area sensor and the peripheral IC are assembled becomes unnecessary, and decrease in cost as a whole becomes possible.

Furthermore, according to the embodiments of the present invention, the NSUB potential can be clipped at the GND level by the Protect signal, problems of excessive current flow can be eliminated even at a time of transient state such as starting up (booting up) and shutting down of the power source.

Although in the embodiments of the present invention, the solid state imaging module that switches the NSUB bias level of the CCD area sensor by selecting it from two levels has been explained, the NSUB bias level can be selected not only form two levels but also from more than two levels by preparing a plurality of setting data for the variable current source and selecting one from the plurality of the setting data.

The present invention has been described in connection with the preferred embodiments. The invention is not limited only to the above embodiments. It is apparent that various modifications, improvements, combinations, and the like can be made by those skilled in the art.

What are claimed are:

1. A charge-coupled device (CCD) solid state imaging module, comprising:
   a CCD area sensor;
   a substrate bias voltage setting device formed on said CCD area sensor for outputting a voltage; and
   a substrate bias voltage outputting device fanned on a chip other than said CCD area sensor for outputting a substrate bias voltage of said CCD area sensor by selecting a voltage level from among a plurality of voltages based on the voltage output by said substrate bias voltage setting device,
   wherein said substrate bias voltage outputting device comprises:
      a bias modulation circuit for generating a modulation voltage, said circuit being connected to said voltage output by said substrate bias voltage setting device, and
   wherein said bias modulation circuit comprises:
      an operational amplifier having a non-inverted input terminal connected to an output voltage from said substrate bias voltage setting device;
      a feedback resistor formed between an inverted input terminal of said amplifier and an output terminal of said amplifier; and
      a switch having a terminal connected to said inverted input terminal and another terminal connected to a variable current source.

2. A charge-coupled device (CCD) solid state imaging module, comprising:
   a CCD area sensor;
   a substrate bias voltage setting device formed on said CCD area sensor for outputting a voltage; and
   a substrate bias voltage outputting device formed on a chip other than said CCD area sensor for outputting a substrate bias voltage of said CCD area sensor by selecting a voltage level from among a plurality of voltages based on the voltage output by said substrate bias voltage setting device,
   wherein said substrate bias voltage outputting device comprises:
      a bias modulation circuit for generating a modulation voltage, said circuit being connected to said voltage output by said substrate bias voltage setting device, and
   wherein said bias modulation circuit comprises:
      a digital-to-analog converter (DAC);
      a switch connected to an output voltage of said DAC;
      an adding device having a terminal connected to said switch, and another terminal for connecting to said output voltage from said substrate bias voltage setting device.

3. The CCD solid state imaging module according to claim 2, wherein said bias modulation circuit further comprises an operational amplifier for impedance-converting a voltage output from said adding device and outputting said modulation voltage.

4. The CCD solid state imaging module according to claim 2, wherein said switch is controlled by a control signal such that when said control signal is low said switch is off and said modulation voltage comprises said output voltage from said substrate bias voltage setting device, and when said control signal is high said switch is on and said modulation voltage comprises a sum of said output voltage from said substrate bias voltage setting device and said output voltage of said DAC.

5. The CCD solid state imaging module according to claim 2, wherein said substrate bias voltage outputting device further comprises:
   another switch connected to said modulation voltage of said bias modulation circuit.

6. The CCD solid state imaging module according to claim 5, wherein said substrate bias voltage outputted from said substrate bias voltage outputting device is connected to an n-type substrate of said CCD area sensor.

7. The CCD solid state imaging module according to claim 6, wherein said CCD area sensor further comprises a p-well formed in said n-type substrate, and
   wherein said another switch prevents a forward bias from impressing to a pn-junction between said n-type substrate and said p-well.

8. The CCD solid state imaging module according to claim 5, wherein said another switch is controlled by another control signal such that when said another control signal is low said another switch is turned on and said substrate bias voltage comprises said modulation voltage, and when said another control signal is high said another switch is turned off and said modulation voltage is disconnected from said substrate bias voltage.

9. The CCD solid state imaging module according to claim 5, wherein said a substrate bias voltage outputting device further comprises a clock driver having an output connected via a capacitive coupling to an n-type substrate of said CCD area sensor.

* * * * *